(12) United States Patent  (10) Patent No.: US 8,094,465 B2
Hund et al.  (45) Date of Patent: Jan. 10, 2012

(54) MODULE AND METHOD FOR PRODUCING A MODULE

(75) Inventors: Paul Hund, Schwieberdingen (DE); Hans-Martin Irslinger, Kusterdingen (DE); Tristan Jobert, Reutlingen (DE); Hans-Peter Baer, Pfullingen (DE)

(73) Assignee: Robert Bosch GmbH, Stuttgart (DE)

( * ) Notice: Subject to any disclaimer, the term of this patent is extended or adjusted under 35 U.S.C. 154(b) by 130 days.

(21) Appl. No.: 12/218,668

(22) Filed: Jul. 16, 2008

(65) Prior Publication Data

US 2009/0021920 A1  Jan. 22, 2009

(30) Foreign Application Priority Data

Jul. 16, 2007 (DE) .................. 10 2007 033 005

(51) Int. Cl.
 *H05K 9/00* (2006.01)
(52) U.S. Cl. .................. 361/816; 361/728; 361/730
(58) Field of Classification Search .................. 361/816, 361/600, 724–726, 728–730, 679.01, 679.02, 361/679.58, 679.59, 800; 439/686, 625, 626, 660, 682, 928; 257/796, 659, 626, 787, 712, 713

See application file for complete search history.

(56) References Cited

U.S. PATENT DOCUMENTS

| 5,418,084 | A | * | 5/1995 | Georgopoulos | ................ | 429/54 |
| 5,862,248 | A | * | 1/1999 | Salatino et al. | ................ | 382/124 |
| 2005/0101161 | A1 | * | 5/2005 | Weiblen et al. | ................ | 439/37 |

FOREIGN PATENT DOCUMENTS

DE  10145540 A1 *  2/2003
DE  103 52 002   6/2005

* cited by examiner

*Primary Examiner* — Hung S Bui
(74) *Attorney, Agent, or Firm* — Kenyon & Kenyon LLP

(57) ABSTRACT

A module, in particular a sensor module, has a module housing, a carrier element, a connection element, and at least one component, the module housing completely enclosing the at least one component and being situated on the carrier element, and the at least one component also being mounted on the connection element and being situated between the connection element and the carrier element.

10 Claims, 3 Drawing Sheets

Fig. 7 a - d

MODULE AND METHOD FOR PRODUCING A MODULE

CROSS-REFERENCE TO RELATED APPLICATIONS

The present application claims priority to Application No. 10 2007 033 005.9, filed in the Federal Republic of Germany on Jul. 16, 2007, which is expressly incorporated herein in its entirety by reference thereto.

FIELD OF THE INVENTION

The present invention is directed to a module and to a method for producing a module.

BACKGROUND INFORMATION

Certain modules are conventional. For example, a sensor module is described in German Published Patent Application No. 103 52 002, the sensor module having a housing main body, a lead frame extending through the housing main body having leads, and a sensor configuration having at least one sensor chip. The sensor chip is mounted on the housing main body, which has a cover made of conductive material for EMC shielding. It has the disadvantage that the cover must be manufactured in a comparatively complex and time-consuming production and mounting method having low manufacturing tolerance, integrated in the housing main body, and subsequently additionally electrically contacted with the main body via a terminal pin.

SUMMARY

Example embodiments of a module and a method for producing a module have the advantage in relation to conventional arrangements that comparatively high-quality EMC shielding of the at least one component is achieved with significantly less manufacturing effort of the module than in conventional arrangements. More cost-effective production of the module is thus made possible. Situating the at least one component between the carrier element and the connection element, which is provided in particular in the area of the at least one component lying at a constant electrical potential, causes electromagnetic shielding of the component in the direction of the connection element and also in the direction of the carrier element, because the carrier element preferably includes a circuit board or card. It is particularly advantageous that no additional cover of the module housing and/or the component must be produced, mounted, and/or electrically contacted for shielding the component, because the connection element preferably has a contact to ground in any case, which is only connected by suitable structuring of the connection element to the connection element area of the component. The electrically conductive connection element, which is produced and structured in comparatively simple and well controllable stamping, bending, and/or embossing processes, concurrently functions as a plurality of contact decks for electrical contacting of the at least one component, as a carrier for the mechanically stable fixing of the component, and for EMC shielding of the component. Therefore, additional components for contacting, fixing, and/or shielding the component and the corresponding work steps for mounting, producing, and/or contacting them are advantageously not necessary. Furthermore, because of the integral design of the connection element, tolerance problems between multiple components are avoided and the production process is thus significantly simplified.

According to example embodiments, the connection element has a closed and/or conductive protective face in an overlap area with the at least one component parallel to the surface normal of the carrier element. The EMC shielding of the at least one component is thus advantageously increased.

According to example embodiments, contacting of the at least one component with the connection element in a contacting plane is provided, the surface normal of the contacting plane being parallel to the surface normal of the carrier element and the contacting plane lying between the protective face and the carrier element, the contacting preferably being performed in the contacting plane in the edge area of the module housing. Contacting of the component with a plurality of contacts is thus made possible in a particularly advantageous manner, the overall overlap of the at least one component parallel to the surface normal to achieve maximum EMC shielding simultaneously being ensured.

According to example embodiments, the connection element has contact pins, which extend parallel to the surface normal from the contacting plane up to the carrier element, and/or the module housing includes a further module housing cover, which is situated between the at least one component and the carrier element. Contact pins of this type advantageously allow simple contacting of the connection element by the carrier element, which preferably has a plurality of printed conductors in the area of the contact pin. The module housing, preferably a mold housing or pre-mold housing, particularly advantageously has the further module housing cover, which produces an isolated atmosphere in the module housing, preferably for protecting the at least one component.

In a method for producing a module according to example embodiments of the present invention, the connection element is stamped and embossed in a first method step, the connection element is extrusion-coated to produce the module housing in a second method step, the at least one component is mounted on the connection element within the module housing in a third method step, and the composite made of the module housing, the connection element, and the at least one component is mounted on the carrier element in a fourth method step such that the at least one component is situated between the connection element and the carrier element. A shielded module is thus advantageously producible in a simple manner and in processes which may be comparatively well-controlled, in particular using standard processes. The mounting of the composite in the fourth method step is preferably executed inverted, i.e., the composite is rotated by 180° such that the surface normal of the protective face is antiparallel after the fourth method step to the surface normal of the protective face in the first through third method steps. To produce the connection element having the protective face, a comparatively simple modification of only the first method step in relation to a standard production process for modules of this type without EMC shielding is required, a rotation of the composite in the fourth method step having to be performed because of this modification. Therefore, the production of a module with EMC shielding is made possible in a particularly advantageous manner solely by the comparatively slight modification of the first and fourth method steps.

According to example embodiments, a fifth method step is interposed between the third and fourth method steps, the further module housing cover being mounted on the module housing. The further module housing cover is advantageously mounted to isolate a protective atmosphere in the interior of the module housing.

According to example embodiments, a sixth method step is performed after the third method step to contact the at least one component and/or a seventh method step is performed to produce the contact pins by bending and/or stamping partial areas of the connection element. The implementation of electrical circuits having a plurality of components in the module housing is made possible in a particularly advantageous manner by the interconnection of the at least one component in the sixth method step.

According to example embodiments of the present invention, a composite is made of the module housing, the connection element, and the at least one component for use in a module. The composite advantageously allows the implementation of an EMC-shielded module in a simple manner solely by mounting and/or contacting the composite on a circuit board and/or a card.

According to example embodiments of the present invention, a module includes module housing having a module housing cover having at least one electrically conductive spring device, an electrically conductive cold contact being provided between the conductive spring device and at least one partial area of the connection element. EMC-shielding of the at least one component is thus advantageously achieved in a simple manner, the cold contact not requiring an additional manufacturing step for contacting the module housing cover. Rather, the cold contact is produced automatically upon mounting of the module housing cover by a spring force of the electrically conductive spring device, which act on at least a partial area of the connection element, so that the module housing cover lies at a fixed electrical potential, preferably at ground. The electrically conductive spring device therefore concurrently functions for locking and contacting the module housing cover in a particularly advantageous manner.

According to example embodiments, the module housing cover is electrically conductive, the module housing cover includes an electrically conductive shielding element, and/or the module housing cover is latched to the module housing. A nonconductive module housing cover is advantageously connected to an electrically conductive shielding element, which has a mechanical contact to the electrically conductive spring device, so that EMC shielding is implemented at least partially in the area of the module housing cover. Latching of the module housing cover to the module housing is preferably provided such that the mounting of the module housing cover is performed particularly advantageously by simple insertion thereof into the module housing.

According to example embodiments, the electrically conductive spring device, the conductive shielding element, and/or the module housing cover are connected to one another using conductive adhesive, a press contact, and/or a laser welding contact. A cost-effective and simple production of the EMC-shielded module is thus advantageously made possible, in particular the module housing cover and the electrically conductive spring device and/or the conductive shielding element, the module housing cover, and the electrically conductive spring device being connected integrally, so that simple mounting in the module housing may be implemented solely by pressing this one part into the module housing.

Exemplary embodiments of the present invention are illustrated in the drawings and explained in greater detail in the following description.

BRIEF DESCRIPTION OF THE DRAWINGS

FIGS. 7a through FIG. 7d show schematic side views of a module according to example embodiments of the present invention.

DETAILED DESCRIPTION

Figure 1:
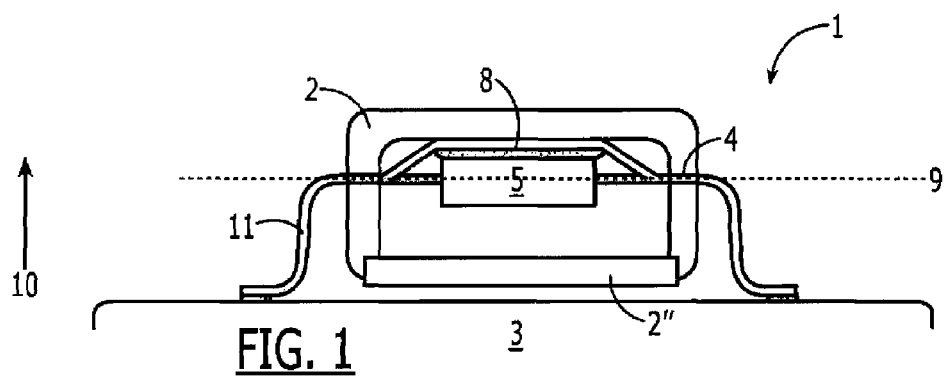
FIG. 1 shows a side view of a module according to an example embodiment of the present invention.

Identical parts are always provided with identical reference numerals in the various figures and are therefore typically also only labeled once.

FIG. 1 shows a side view of a module 1 according to an example embodiment of the present invention, module 1, preferably a sensor module and particularly preferably an acceleration sensor or speed sensor, having a module housing 2, a carrier element 3, a connection element 4, and at least one component 5, and module housing 2 completely enclosing the at least one component 5 and being situated on carrier element 3, and furthermore the at least one component 5 being mounted on connection element 4 and being situated between connection element 4 and carrier element 3. Furthermore, connection element 4 includes a closed and conductive protective face 8 in an overlap area with the at least one component 5 parallel to surface normal 10 of carrier element 3, protective face 8 being provided lying at a fixed electrical potential in particular, so that EMC shielding of the at least one component 5 is ensured in the direction of protective face 8. Electrical contacting of the at least one component 5 with connection element 4 is provided in a contacting plane 9, the surface normal of contacting plane 9 being parallel to surface normal 10 of carrier element 4 and contacting plane 9 lying between protective phase 8 and carrier element 3, the contacting in contacting plane 9 preferably occurring in the edge area of module housing 2. Moreover, connection element 4 has contact pins 11, which extend parallel to surface normal 10 from contacting plane 9 up to carrier element 3, contact pins 11 allowing electrical contacting of connection element 4 by carrier element 3. In particular, a system of a plurality of parallel contact pins 11 and thus a multipole contact of connection element 4 is provided. Carrier element 3 preferably has printed conductors in the area of contact pins 11, carrier element 3 particularly preferably having a conductive, flat structure in the overlap area with the at least one component 5 parallel to surface normal 10, the structure lying at a fixed electrical potential, so that EMC shielding of the at least one electrical component 5 in the direction of carrier element 3 is ensured. Carrier element 3 very particularly preferably includes a circuit board and/or a card having structures of this type. Module housing 2 also includes a further module housing cover 2", preferably made of plastic, which is situated between the at least one component 5 and carrier element 3 and in particular allows an isolation of the atmosphere in the interior of module housing 2.

Figure 2:
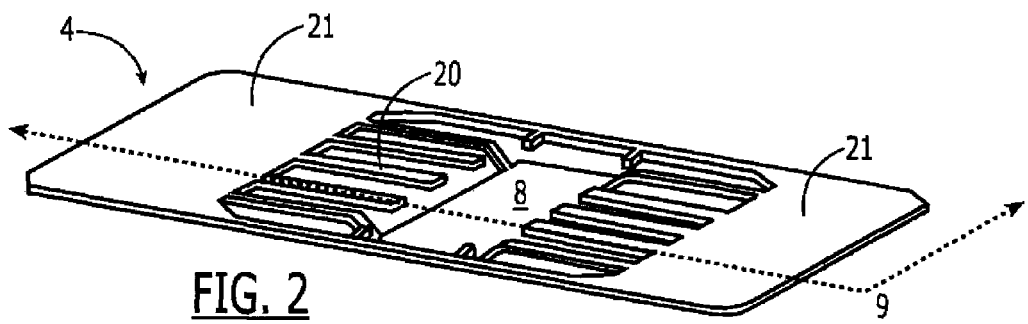
FIG. 2 shows a perspective illustration of a first precursor structure of the method according to an example embodiment of the present invention for producing a module.

FIG. 2 shows a perspective illustration of a first precursor structure of the method according to example embodiments of the present invention for producing a module 1, a first method step for stamping and/or embossing connection element 4 being illustrated as an example on the basis of the first precursor structure. The image shows connection element 4 having conductive and completely closed protective layer 8, on which the at least one component 5 is mounted in one of the following method steps. Furthermore, connection element 4 has openings 20 in contacting plane 9, which are provided for contacting the at least one component 5 in one of the following method steps. Furthermore, connection element 4 has flat external areas 21, which are stamped, embossed, and/or bent in particular to produce contact pins 11.

Figure 3:
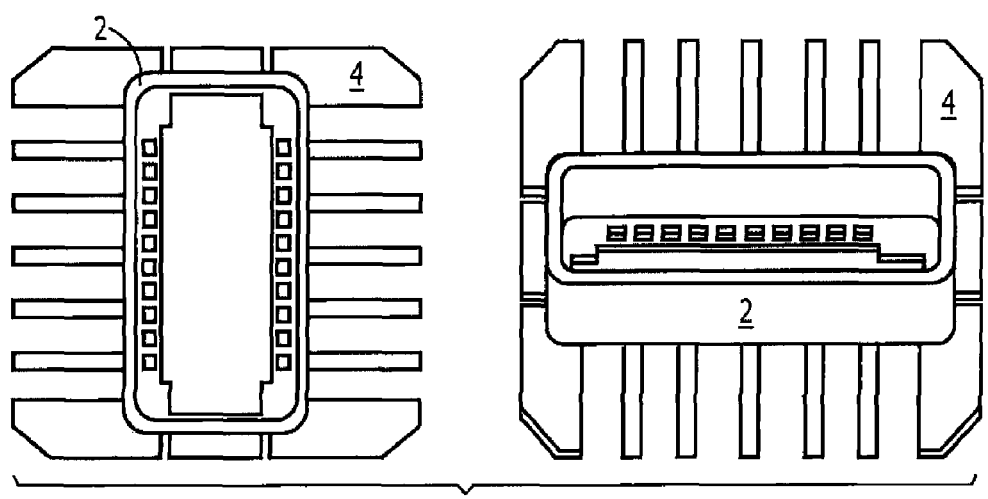
FIG. 3 shows a top view and a perspective illustration of a second precursor structure of a method according to an example embodiment of the present invention for producing a module.

FIG. 3 shows a top view and a perspective illustration of a second precursor structure of a method according to example embodiments of the present invention for producing a module 1, a second method step being illustrated on the basis of the second precursor structure. In the second method step, connection element 4 is extrusion-coated, preferably using plastic, at least in the area of protective layer 8 and/or the at least one component 5 to produce module housing 2. Module housing 2 therefore includes a molded housing. Connection element 4 is particularly preferably extrusion-coated such that openings 20 in contacting plane 9 are situated inside module housing 2.

Figure 4:
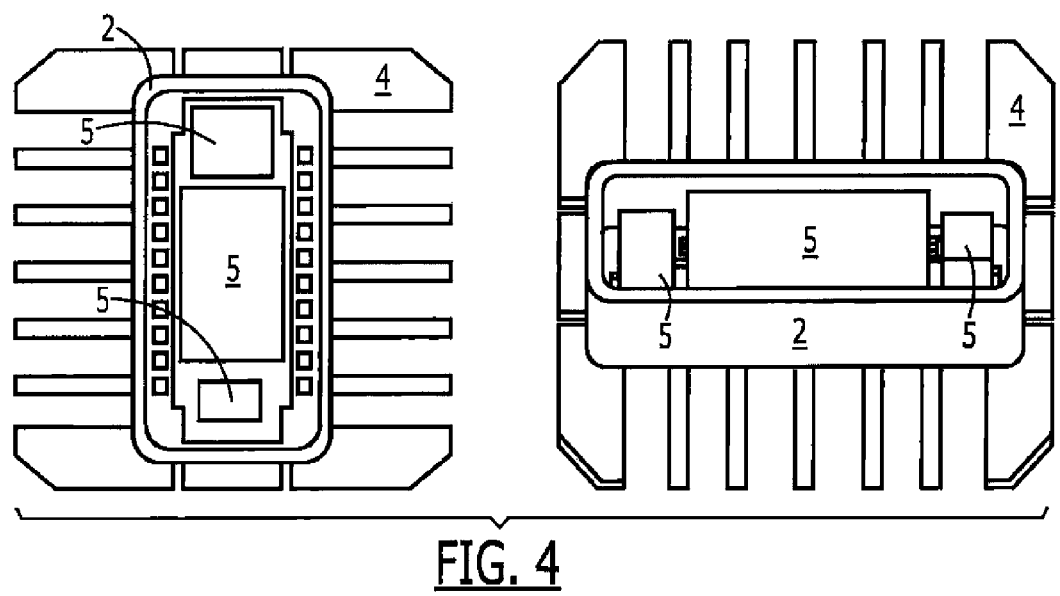
FIG. 4 shows a top view and a perspective illustration of a third precursor structure of a method according to an example embodiment of the present invention for producing a module.

FIG. 4 shows a top view and a perspective illustration of a third precursor structure of a method according to example embodiments of the present invention for producing a module 1, a third method step being illustrated on the basis of the third precursor structure. In the third method step, the at least one component 5 is mounted on connection element 4 inside module housing 2, preferably by gluing and/or soldering. The mounting procedure preferably simultaneously includes the electrical contacting of the at least one component 5, particularly preferably with openings 20 of connection element 4. Otherwise, contacting of the at least one component 5 is provided in a sixth method step. Electrical contacting is provided in particular by gluing using conductive adhesive, soldering, bonding, and/or the production of cold contacts.

Figure 5:
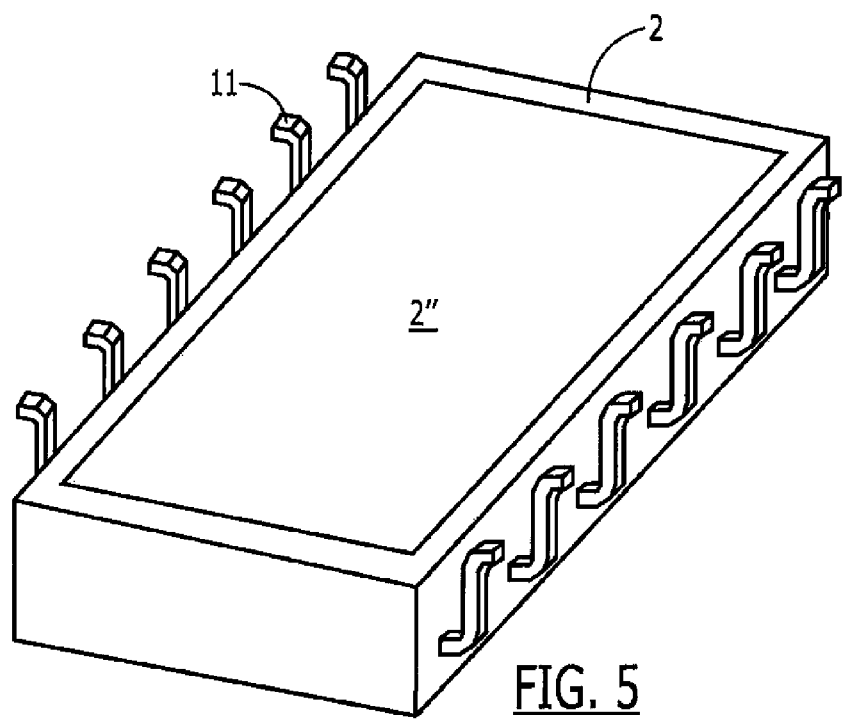
FIG. 5 shows a perspective illustration of a fourth precursor structure of a method according to an example embodiment of the present invention for producing a module.

FIG. 5 shows a perspective illustration of a fourth precursor structure of a method according to example embodiments of the present invention for producing a module 1, a fifth method step for mounting module housing cover 2" on module housing 2, in particular by gluing, being performed on the basis of the fourth precursor structure, and a seventh method step for producing contact pins 11 by bending and/or embossing connection element 4 being performed in particular on the basis of the fourth precursor structure, contact pins 11 preferably extending parallel to the surface normal of protective layer 8 from contacting plane 9 up to and over the entire module housing height parallel to the surface normal of protective layer 8.

Figure 6:
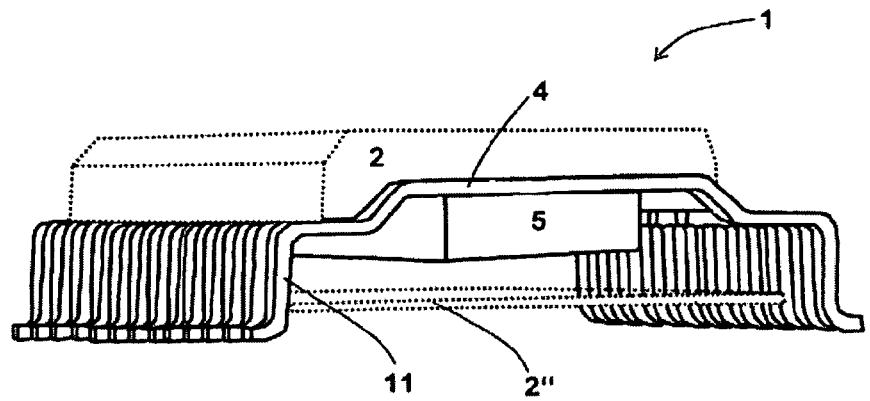
FIG. 6 shows a perspective illustration of a module according to an example embodiment of the present invention.
Figure 6:
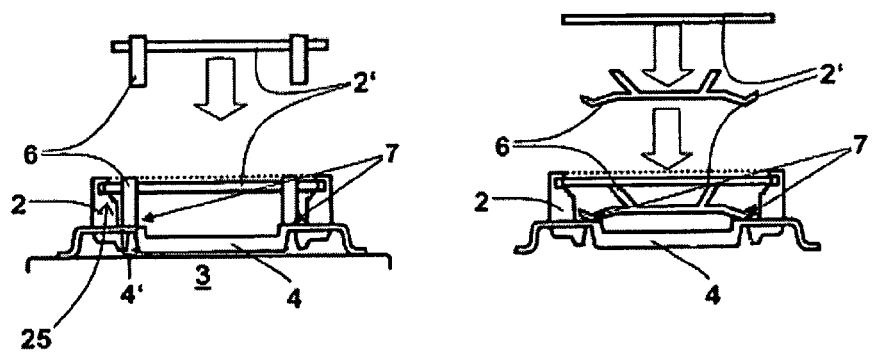
Figure 6:
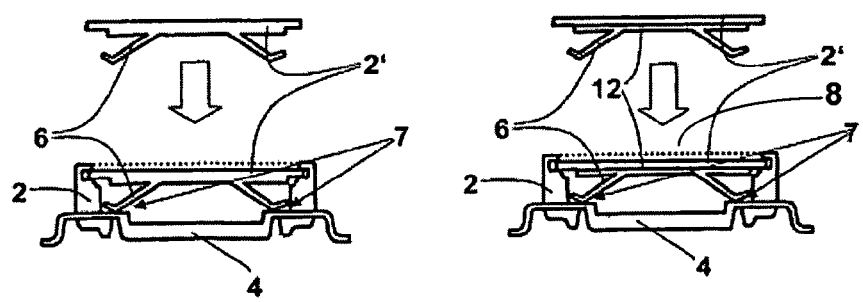

FIG. 6 shows a perspective illustration of a module according to example embodiments of the present invention.

FIGS. 7a through 7d show schematic side views of a module 1 according to example embodiments of the present invention, modules 1 each having a module housing 2, a carrier element 3, and at least one component 5 in the interior of module housing 2 and on carrier element 3, and module housing 2 having a module housing cover 2" having an electrically conductive spring device 6, and also an electrically conductive cold contact 7 being provided between spring device 6 and at least one partial area 4' of connection element 4. In particular, module housing cover 2" is electrically conductive (FIGS. 7a, b, c) or has an electrically conductive shielding element 8 (FIG. 7d), which has an electrically conductive connection to electrically conductive spring device 6 and is preferably oriented parallel to module housing cover 2" and is integrally joined and/or friction-locked thereto. Conductive module housing cover 2" or conductive shielding element 8 is connected by the electrically conductive connection via electrically conductive spring device 6 to connection element 4, so that they lie at a fixed electrical potential and thus cause EMC shielding of the at least one component 5 in the direction of module housing cover 2". Electrically conductive spring elements 6 cause a pressure load of module housing cover 2" in a direction which is oriented away from connection element 4 and parallel to surface normal 10 of connection element 4. The module housing preferably has openings 25, module housing cover 2" engaging in openings 25 in the edge area upon insertion into module housing 2 and being fixed therein by the pressure load of electrically conductive spring device 6. The various exemplary embodiments differ solely in the arrangement and the production process of module housing cover 2 having electrically conductive spring device 6, module housing cover 2" being welded, glued, pressed, and/or connected by cold contacting to electrically conductive spring device 6. If an adhesive is used, the use of a high-resistance or a low-resistance adhesive is provided.

What is claimed is:

1. A module, comprising:
a module housing;
a carrier element;
a connection element; and
at least one component;
wherein the module housing completely encloses the at least one component and is situated on the carrier element;
wherein the at least one component is mounted on the connection element and is situated between the connection element and the carrier element, and
wherein the module housing has a module housing cover having at least one electrically conductive spring device, an electrically conductive cold contact being provided between the conductive spring device and at least one partial area of the connection element.

2. The module according to claim 1, wherein the module is arranged as a sensor module.

3. The module according to claim 1, wherein the module housing cover at least one of (a) is electrically conductive, (b) includes an electrically conductive shielding element, and (c) is latched to the module housing.

4. The module according to claim 3, wherein at least one of (a) the electrically conductive spring device, (b) the conductive shielding element, and (c) the module housing cover is connected by at least one of (a) a conductive adhesive, (b) a press contact, and (c) a laser welding contact.

5. The module according to claim 1, wherein the connection element includes at least one of (a) a closed and (b) a conductive protective face in an overlap area with the at least one component parallel to a surface normal of the carrier element.

6. The module according to claim 1, wherein contacting of the at least one component with the connection element is provided in a contacting plane, a surface normal of the contacting plane being parallel to a surface normal of the carrier element and the contacting plane lying between a protective face and the carrier element, the contact being provided in the contacting plane in an edge area of the module housing.

7. The module according to claim 1, wherein at least one of (a) the connection element has contact pins that extend parallel to a surface normal from a contacting plane up to the carrier element and (b) the module housing includes a further module housing cover situated between the at least one component and the carrier element.

8. A method for producing a module, comprising:
- at least one of (a) stamping and (b) embossing a connection element;
- extrusion coating the connection element to produce a module housing;
- mounting at least one component on the connection element inside the module housing;
- mounting an assembly of the module housing, the connection element, and the at least one component on a carrier element such that the at least one component is situated between the connection element and the carrier element,
- wherein the module housing completely encloses the at least one component, and
- wherein the module housing has a module housing cover having at least one electrically conductive spring device, an electrically conductive cold contact being provided between the conductive spring device and at least one partial area of the connection element.

9. The method according to claim 8, further comprising mounting a further module housing cover between the mounting of the at least one component on the connection element inside the module housing and the mounting of the assembly on the carrier element.

10. The method according to claim 8, further comprising at least one of (a) after the mounting of the at least one component on the connection element inside the module housing, contacting the at least one component and (b) producing contact pins by at least one of (a) bending and (b) stamping partial areas of the connection element.

* * * * *